US008581171B2

(12) United States Patent
Kawahito et al.

(10) Patent No.: US 8,581,171 B2
(45) Date of Patent: Nov. 12, 2013

(54) CYCLIC A/D CONVERTER, IMAGE SENSOR DEVICE, AND METHOD FOR GENERATING DIGITAL SIGNAL FROM ANALOG SIGNAL

(75) Inventors: Shoji Kawahito, Hamamatsu (JP); Jong-ho Park, Hamamatsu (JP); Satoshi Aoyama, Hamamatsu (JP); Keigo Isobe, Hamamatsu (JP)

(73) Assignee: National University Corporation Shizuoka University (JP)

( * ) Notice: Subject to any disclaimer, the term of this patent is extended or adjusted under 35 U.S.C. 154(b) by 297 days.

(21) Appl. No.: 13/124,319

(22) PCT Filed: Oct. 15, 2009

(86) PCT No.: PCT/JP2009/067853
§ 371 (c)(1),
(2), (4) Date: Jun. 9, 2011

(87) PCT Pub. No.: WO2010/044444
PCT Pub. Date: Apr. 22, 2010

(65) Prior Publication Data
US 2011/0240832 A1    Oct. 6, 2011

(30) Foreign Application Priority Data

Oct. 17, 2008   (JP) ................. P2008-269001

(51) Int. Cl.
*H01L 27/146*       (2006.01)
(52) U.S. Cl.
USPC ............. 250/214 A; 250/208.1; 341/126; 341/155
(58) Field of Classification Search
USPC .............. 250/214 A, 208.1; 341/126, 155
See application file for complete search history.

(56) References Cited

U.S. PATENT DOCUMENTS

| 4,748,440 A | 5/1988 | Kobayashi |
| 8,149,150 B2 * | 4/2012 | Kawahito .............. 341/126 |

(Continued)

FOREIGN PATENT DOCUMENTS

| JP | 62-56023 | 3/1987 |
| JP | 2005-136540 | 5/2005 |

(Continued)

OTHER PUBLICATIONS

International Preliminary Report on Patentability issued on May 19, 2011 in connection with corresponding International Application No. PT/JP2009/067853.

(Continued)

*Primary Examiner* — Tony Ko
(74) *Attorney, Agent, or Firm* — Ostrolenk Faber LLP

(57) ABSTRACT

A cyclic A/D converter which can reduce the number of reference voltages for D/A conversion is provided. The cyclic A/D converter (11) comprises a gain stage (15), an A/D converter circuit (17), a logic circuit (19), and a D/A converter circuit (21). In an operational action of the gain stage (15), an operational value ($V_{OP}$) is generated by the use of an operational amplifier circuit (23) and capacitors (25, 27, 29). The gain stage (15) operates as receiving three kinds of voltage signal from the D/A converter circuit (21) by the switching of two kinds of voltage signal ($V_{DA1}$, $V_{DA2}$) to be applied to the capacitors (25, 27) in a switching circuit (31). That is, the D/A converter circuit (21) provides a voltage signal ($V_{RH}$) to the capacitors (25, 27), in response to a value (D=2) of a digital signal ($B_0$, $B_1$), provides voltage signals ($V_{RH}$, $V_{RL}$) to the capacitors (25, 27), respectively, in response to a value (D=1) of the signal ($B_0$, $B_1$), and provides the voltage signal ($V_{RL}$) to the capacitors (25, 27), in response to a value (D=0) of the signal ($B_0$, $B_1$).

12 Claims, 10 Drawing Sheets

(56) References Cited

U.S. PATENT DOCUMENTS

2008/0191919 A1    8/2008  Garrity et al.
2011/0006935 A1*   1/2011  Kawahito .................... 341/126
2011/0240832 A1*  10/2011  Kawahito et al. .......... 250/208.1

FOREIGN PATENT DOCUMENTS

| JP | 2007-104531 | 4/2007 |
| JP | 2007-104655 | 4/2007 |
| JP | 2007-208815 | 8/2007 |
| JP | 2008-141396 | 6/2008 |
| JP | 2008-141397 | 6/2008 |
| JP | 2008-141399 | 6/2008 |

OTHER PUBLICATIONS

International Search Report mailed Dec. 1, 2009 in connection with corresponding International Application No. PCT/JP2009/067853.
Untranslated Chinese Office Action mailed May 9, 2013 issued in corresponding Chinese Application No. 200980141382.7.

* cited by examiner (a)

(b)

CYCLIC A/D CONVERTER, IMAGE SENSOR DEVICE, AND METHOD FOR GENERATING DIGITAL SIGNAL FROM ANALOG SIGNAL

CROSS REFERENCE TO RELATED APPLICATIONS

The present application is a 35 U.S.C. §371 national phase conversion of PCT/JP2009/067853 filed Oct. 15, 2009 and claims priority of JP2008-269001 filed Oct. 17, 2008, both incorporated herein in their entirety.

TECHNICAL FIELD

The present invention relates to a cyclic A/D converter, an image sensor device, and a method for generating a digital signal from an analog signal.

BACKGROUND ART

Patent document 1 discloses an A/D converter array. An A/D converter circuit of the A/D converter array includes two capacitors and an inverting amplifier. A DA converter part of the A/D converter circuit provides any of three values ($V_{RM}$, $V_{RP}$, and GND) to one of the capacitors.

Patent document 2 discloses a cyclic A/D converter. This cyclic A/D converter includes two pairs of capacitors, and an amplifier having a differential input and a differential output. A DA converter part of the A/D converter provides any of three values ($V_{RM}$, $V_{RP}$, and Common) to a pair of capacitors.

Patent document 3 discloses a highly accurate cyclic A/D converter. This A/D converter includes three capacitors and a differential-input operational amplifier. A DA converter part of the A/D converter provides any of three values ($+V_R$, $-V_R$, and GND) for predetermined one of the three capacitors.

Patent document 4 discloses a cyclic A/D converter. This A/D converter includes two pairs of capacitors and an amplifier having a differential input and a differential output. A DA converter part of the A/D converter provides any of three values ($+V_{ref1}$, $-V_{ref2}$, and COMMON) to a pair of capacitors.

Patent document 5 discloses an N-bit A/D converter. This converter includes two pairs of capacitors and an operational amplifier circuit. A DA converter circuit of the A/D converter provides any of three values ($+V_R$, $-V_R$, and GND) to a pair of capacitors.

Patent document 6 discloses an analog-digital converter. This analog-digital converter includes four capacitors and an operational amplifier circuit. A DA converter circuit of the A/D converter provides any of three values ($V_{REFP}$, $V_{REFN}$, and COMMON) to a pair of the capacitors.

Patent document 7 discloses an A/D convertor. This A/D converter includes two capacitors and an operational amplifier circuit. A DA converter circuit of the A/D converter provides any of three values ($V_{RM}$, $V_{RP}$, and COMMON) to a pair of the capacitors.

CITATION LIST

Patent Literature

Patent document 1: Japanese Patent Application Laid-Open Publication No. 2005-136540
Patent document 2: Japanese Patent Application Laid-Open Publication No. 2007-104531
Patent document 3: Japanese Patent Application Laid-Open Publication No. 2007-208815
Patent document 4: Japanese Patent Application Laid-Open Publication No. 2008-141397
Patent document 5: Japanese Patent Application Laid-Open Publication No. 2008-141399
Patent document 6: Japanese Patent Application Laid-Open Publication No. 2008-141396
Patent document 7: Japanese Patent Application Laid-Open Publication No. 2007-104655

SUMMARY OF INVENTION

Technical Problem

Each of the A/D converters of Patent documents 1 to 7 uses a gain stage including a single operational amplifier circuit and plural capacitors. A circuit of the gain stage has either a single end configuration or a differential amplification configuration. A differential amplification type gain stage requires the number of capacitors two times that of a single end type gain stage. On the other hand, a cyclic action of the single end type gain stage requires reference voltages of the above three values ($V_{RM}$, $V_{RP}$, and zero). These reference voltages are provided by the DA converter circuit of the A/D converter.

Since the above number of capacitors is different between the single end type gain stage and the differential amplification type gain stage, the circuit area of the single end type gain stage is smaller than that of the differential amplification type gain stage. In the single end type gain stage, however, any of the three-value reference voltages is provided to one end of a capacitor within the gain stage. When these reference voltages are not generated accurately, an error is caused in A/D conversion and linearity is lost in an A/D converter characteristics. However, it is not easy to generate the reference voltages accurately. In a semiconductor integrated circuit, while a circuit using resistance voltage division is used for generating the reference voltages, the accuracy of the resistance ratio is not high in the semiconductor integrated circuit. For the generation of a highly accurate reference voltage by the accurate voltage division, resistance value trimming is performed. The use of this trimming not only increases the area of the A/D converter but also requires a trimming value of the A/D converter to be adjusted.

The present invention has been achieved in view of such a situation and aims at providing a cyclic A/D converter which can reduce the number of reference voltages for D/A conversion, and at providing an image sensor device including this cyclic A/D converter, and further at providing a method which generates a digital signal from an analog signal and can reduce the number of the reference voltages for the D/A conversion.

Solution to Problem

An aspect of the present invention is a cyclic A/D converter. This cyclic converter comprises: (a) a gain stage including an input receiving an analog signal to be converted to a digital value, an output, and a single end type operational amplifier circuit having a first input, a second input, and an output; (b) an A/D converter circuit generating a digital signal including plural bits according to a signal from the output of the gain stage or the analog signal; (c) a logic circuit generating a control signal having first to third values according to the digital signal; and (d) a D/A converter circuit providing the gain stage with at least one of first and second voltage signals in response to the control signal. The gain stage includes first to third capacitors. The second input of the operational amplifier circuit receives a reference potential, the gain stage performs an operational action generating an operational value with the operational amplifier circuit and the first to third capacitors and performs a storage action storing the operational value into the first and second capacitors, and the D/A converter circuit has first and second outputs respectively connected to the first and second capacitors. In the operational action, the third capacitor is connected between the output and the first input of the operational amplifier circuit and also the first and second capacitors are connected between the D/A converter circuit and the first input, and resultantly the operational value is generated at the output of the gain stage. The D/A converter circuit provides the first output with either of the first and second voltage signals and also includes a switching circuit for providing the second output with either of the first and second voltage signals, in response to the control signal.

According to this cyclic A/D converter, the first and second capacitors are connected to the first and second outputs of the D/A converter circuit, respectively, and the switching circuit of the D/A converter circuit can provide the first output with at least either of the first and second voltage signals and also can provide the second output with at least either of the first and second voltage signals, in response to the control signal. Accordingly, in the operational action, the first and second voltage signals are switched so as to be applied to each one end of the first and second capacitors by the use of the switching circuit, and thus the gain stage operates as receiving three kinds of voltage signal from the D/A converter circuit.

In the cyclic A/D converter according to the present invention, the switching circuit supplies the first voltage signal to both of the first and second capacitors in response to the first value of the control signal, supplies the first and second voltage signals to the first and second capacitors, respectively, in response to the second value of the control signal, and supplies the second voltage signal to both of the first and second capacitors in response to the third value of the control signal.

According to this cyclic A/D convertor, when the first and second voltage signals of the D/A converter circuit are provided to the first and second capacitors, respectively, the first and second voltage signals are combined via the first and second capacitors.

In the cyclic A/D converter according to the present invention, the switching circuit includes a first switch connected between a source of the first voltage signal and the first output, a second switch connected between source of the second voltage signal and the second output, and a third switch connected between the first output and the second output. The D/A converter circuit supplies the first voltage signal to the first capacitor and the second capacitor via the first output and the second output, respectively, by turning on the first switch and the third switch in response to the first value of the control circuit. The D/A converter circuit supplies the first voltage signal to the first capacitor via the first output by turning on the first switch and also supplies the second voltage signal to the second capacitor via the second output by turning on the second switch, in response to the second value of the control signal. The D/A converter circuit supplies the second voltage signal to the first capacitor and the second capacitor via the first output and the second output, respectively, by turning on the second switch and the third switch in response to the third value of the control signal.

According to this cyclic A/D converter, when the first and second voltage signals are switched and provided to the first and second capacitors by the use of the first to third switches, a third voltage value is synthesized from the first and second voltage signals.

In the cyclic A/D converter according to the present invention, in the storage action, the third capacitor can be connected between the output and the first input of the operational amplifier circuit and also the first and second capacitors can be connected between the output of the operational amplifier circuit and the reference potential. According to this cyclic A/D converter, the signal for the next cyclic A/D conversion is stored in the first and second capacitors.

In the cyclic A/D converter according to the present invention, the gain stage can further perform an initial reset action. In the initial reset action, the first to third capacitors can be connected between the first input of the operational amplifier circuit and the output of the operational amplifier circuit and also the first input of the operational amplifier circuit can be connected to the output of the operational amplifier circuit. According to this cyclic A/D converter, the initial reset action of the first to third capacitors can be performed by the use of the operational amplifier circuit.

In the cyclic A/D converter according to the present invention, in an initial storage action, the gain stage connects the first input of the operational amplifier circuit and the output of the operational amplifier circuit to each other and also receives the analog signal at the first to third capacitors. According to this cyclic A/D converter, the analog signal can be stored in the first to third capacitors in the initial storage action.

Another aspect of the present invention is an image sensor device. This image sensor device includes: (a) a cell array containing an array of image sensor cells; and (b) a converter array connected to the cell array and containing plural cyclic A/D converters. Each of the cyclic A/D converters is connected to the image sensor cell via a column line of the cell array, and each of the cyclic A/D converters is one described above. According to this image sensor device, each of the cyclic A/D converters uses the D/A converter circuit which provides the gain stage with at least either one of the first and second voltage signals. Thus, the area of the image sensor device can be minimized.

In the image sensor device according to the present invention, the image sensor cell can generate a first signal indicating a reset level and a second signal indicating a signal level superimposed on the reset level. The gain stage connects the output and the first input of the operational amplifier circuit to each other and also connects the first and second capacitors between the input of the gain stage and the first input of the operational amplifier circuit, and then receives the signal of the reset level at the first and second capacitors. The gain stage connects the third capacitor between the output and the first input of the operational amplifier circuit and also connects the first and second capacitors between the input of the gain stage and the first input of the operational amplifier circuit, and then receives the signal of the signal level at the first and second capacitors.

According to this image sensor device, the reset level by a reset action can be cancelled from the second signal by the use of the gain stage.

In the image sensor device according to the present invention, a noise cancelling circuit can be further provided. The image sensor cell can generate a first signal which indicates the reset level and includes a first redundant bit sequence and a second signal which indicates the signal level superimposed on the reset level and includes a second redundant bit sequence, and the noise cancelling circuit includes a first storage circuit storing a first A/D conversion value of the reset level signal, a second storage circuit storing a second A/D conversion value of the signal level signal, and an operational circuit which generates a difference between the first A/D conversion value and the second A/D conversion value and subtracts the reset level from the second signal to cancel a reset noise. According to this image sensor device, the reset level by the reset action can be cancelled from the second signal by the use of respective digital signals of the first and second signals from the image sensor cell.

In the image sensor device according to the present invention, the operational amplifier circuit includes first and second redundant-nonredundant conversion circuits converting the first redundant bit sequence (first signal) and the second redundant bit sequence (second signal) into nonredundant bit sequences respectively, a complementer, and an adder, and can output a difference between an output value of the first redundant-nonredundant conversion circuit and an output value of the second redundant-nonredundant conversion circuit as a noise-cancelled value. According to this image sensor device, the difference between the output value of the first redundant-nonredundant conversion circuit and the output value of the second redundant-nonredundant conversion circuit can be generated by the use of the complementer and the adder.

The image sensor device according to the present invention can further include a first reference voltage circuit generating the first voltage signal, a second reference voltage circuit generating the second voltage signal, a first conductor line connected to the first reference voltage circuit, and a second conductor line connected to the second reference voltage circuit. The D/A converter circuit in each of the cyclic A/D converters is connected to the first and second conductor lines. According to this image sensor device, not three but two conductor lines are used for providing each of the cyclic A/D converters with the first and second voltage signals.

Still another aspect of the present invention is a method which generates a digital signal from an analog signal by using the cyclic A/D converter. The method includes the steps of: (a) storing A signal having an analog value into first to third capacitors; (b) generating $D_0$ signal which represents a digital value of A signal and has any of first to third values; (c) after the generation of $D_0$ signal, connecting the third capacitor between the output of an operational amplifier circuit and the first input of the operational amplifier circuit and also connecting each one end of the first and the second capacitors to the first input of the operational amplifier circuit, and then generating an operational value at the output of the operational amplifier circuit by applying a D/A signal to the other end of the first capacitor and the other end of the second capacitor; (d) storing the operational value into the first and second capacitors and also generating $D_i$ signal which represents a digital value of the operational value and has first to third values; (e) repeating the steps (c) and (d) to generate the digital signal. The D/A signal is at least either one of first and second voltage signals having analog values corresponding to $D_0$ signal and $D_i$ signal, respectively. When $D_0$ signal indicates the first value, the first voltage signal is applied to the other end of the first capacitor and the other end of the second capacitor, when $D_0$ signal indicates the second value, the second voltage signal is applied to the other end of the first capacitor and the other end of the second capacitor, and when $D_0$ signal indicates the third value, the first and second voltage signals are applied to the other ends of the first and second capacitors, respectively. Further, when $D_i$ signal indicates the first value, the first voltage signal is applied to the other end of the first capacitor and the other end of the second capacitor, when $D_i$ signal indicates the second value, the second voltage signal is applied to the other end of the first capacitor and the other end of the second capacitor, and when $D_i$ signal indicates the third value, the first and second voltage signals are applied to the other ends of the first and second capacitors, respectively. The second input of the operational amplifier circuit receives the reference potential.

According to this method, in the cyclic A/D conversion, it is possible to receive the analog signal and also generate the digital signal representing this analog signal by using two kinds of voltage signal without using three kinds of voltage signal.

The above object and other objects, features and advantages of the present invention will easily become clearer from the following detailed description carried on for preferable embodiments of the present invention with reference to the accompanying drawings.

Advantageous Effects of Invention

An aspect of the present invention provides a cyclic A/D converter which can reduce the number of reference voltages for D/A conversion. Further, another aspect of the present invention provides an image sensor device including the cyclic A/D converter. Moreover, still another aspect of the present invention provides a method which generates a digital signal from an analog signal and can reduce the number of reference voltages for D/A conversion.

DESCRIPTION OF EMBODIMENTS

The finding of the present invention can be easily understood in the consideration of the following detailed description with reference to the accompanying drawings shown as illustration. Successively, there will be explained embodiments of a cyclic A/D converter, an image sensor device, and a method of generating a digital signal from an analog signal according to the present invention with reference to the drawings. The same part will be denoted by the same reference sign when it is possible.

Figure 1:
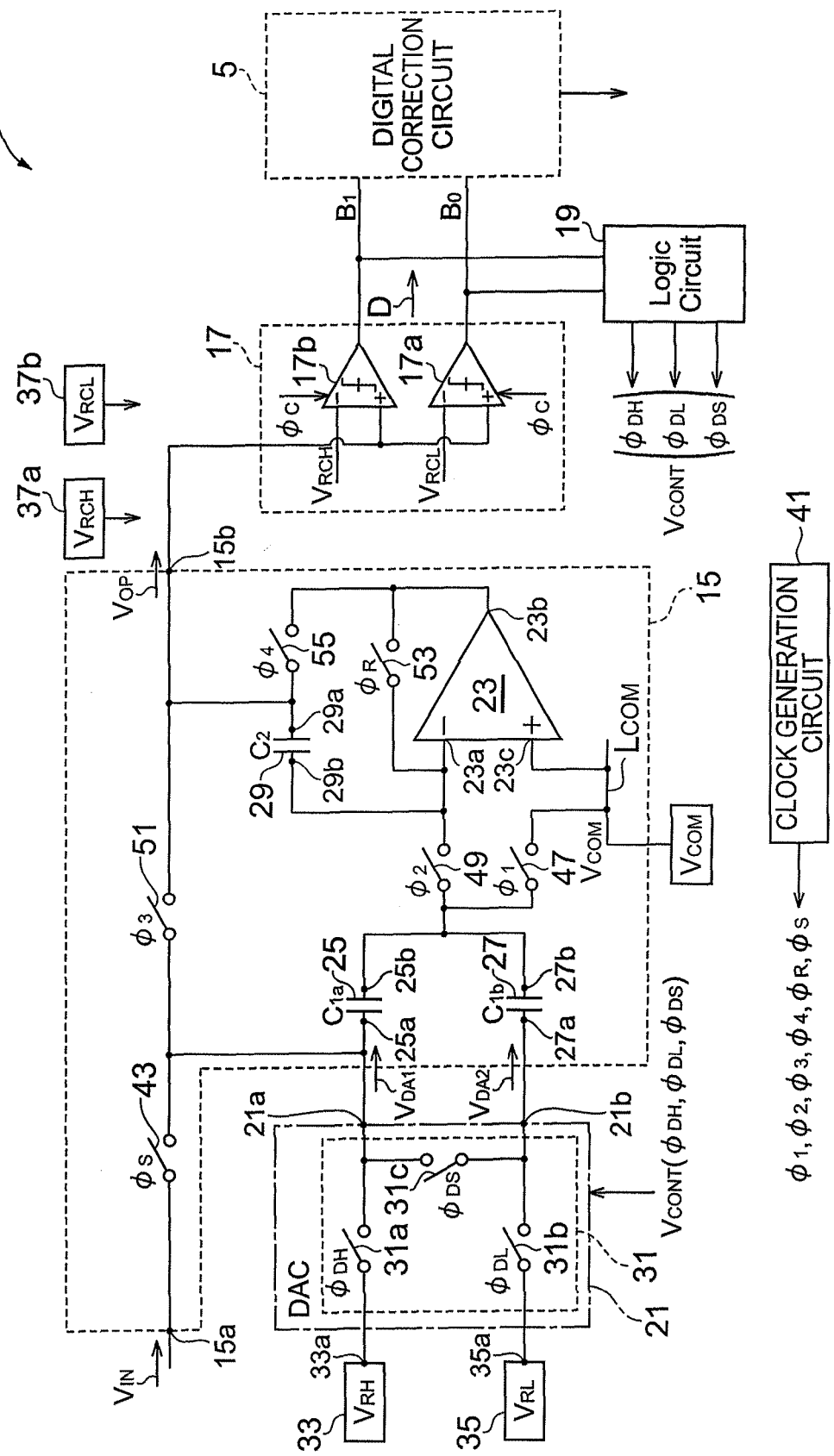
FIG. 1 is a diagram showing a circuit block of a cyclic A/D converter according to the present embodiment.

FIG. 1 is a diagram showing a circuit block of a cyclic A/D converter according to the present embodiment. This cyclic A/D converter 11 is provided with a gain stage 15, an A/D converter circuit 17, a logic circuit 19, and a D/A converter circuit 21. The gain stage 15 includes an input 15a receiving an analog signal $V_{IN}$ to be converted to a digital value and an output 15b providing an operational value $V_{OP}$ for each one cycle. Further, the gain stage 15 includes a single end type operational amplifier circuit 23 and first to third capacitors 25, 27, and 29. The operational amplifier circuit 23 has a first input 23a, an output 23b, and a second input 23c, and the signal phase of the output 23b is inverted from the phase of a signal provided to the first input 23a. For example, the first and second input 23a and 23c are an inverted input terminal and a non-inverted input terminal, respectively, and the output 23b is a noninverted output terminal. The second input 23c of the operational amplifier circuit 23 is connected to a reference potential line $L_{COM}$ and receives a reference potential $V_{COM}$, for example. The A/D converter circuit 17 generates a digital signal D according to the signal $V_{OP}$ from the output 23b of the gain stage 23 or the analog signal $V_{IN}$.

The A/D converter circuit 17 can include two comparators 17a and 17b, for example. The comparators 17a and 17b compares the input analog signal with predetermined reference signals $V_{RCH}$ and $V_{RCL}$, respectively, and also provides comparison result signals B0 and B1 as shown in FIG. 1. The reference signals $V_{RCH}$ and $V_{RCL}$ are provided by voltage sources 37a and 37b, respectively. The digital signal D indicates an A/D conversion value for each one cycle. The digital signal D has two bits ($B_0$ and $B_1$), for example, and each of the bits ($B_0$ and $B_1$) can take "1" or "0". The cyclic A/D converter 11 has first to third values (D=0, D=1, and D=3) generated by the combinations of the bits ($B_0$ and $B_1$) as the digital values for each one cycle. The logic circuit 19 generates a control signal $V_{CONT}$ (e.g., $\phi_{DH}$, $\phi_{DL}$, or $\phi_{DS}$) according to the digital signal D. If necessary, the A/D converter circuit 17 can compare the operational value $V_{OP}$ with the reference signals by using one comparator in time division, for example, and can provide the signal B0 and B1 indicating the comparison result.

The gain stage 15 can include an operational action and a storage operation. In the operational action, the operational value $V_{OP}$ is generated by the operational amplifier circuit 23 and the first to third capacitors 25, 27, and 29. In the storage action, the operational value $V_{OP}$ is stored into the first and second capacitors 25 and 27.

In this cyclic A/D converter 11, the first and second capacitors 25 and 27 are connected to outputs 21a and 21b of the D/A converter circuit, respectively. Further, a switching circuit 31 of the D/A converter circuit 21 can provide the first output 21a with at least either of voltage signals $V_{DA1}$ and $V_{DA2}$ and also can provide the second output 21b with at least either of the voltage signals $V_{DA1}$ and $V_{DA2}$, in response to the control signal $V_{CONT}$. Accordingly, in the operational action, by switching the voltage signals $V_{DA1}$ and $V_{DA2}$ to be applied to each one end of the capacitors 25 and 27 by using the switching circuit 31, the gain stage 15 operates as receiving three kinds of voltage signal from the D/A converter circuit 21. Specifically, in the cyclic D/A converter 11, the D/A converter circuit 21 provides a voltage signal $V_{RH}$ to the capacitors 25 and 27 in response to the first value (D=2) of the digital signal ($B_0$, $B_1$). The D/A converter circuit 21 provides voltage signals $V_{RH}$ and $V_{RL}$ to the capacitors 25 and 27, respectively, in response to the second value (D=1) of the digital signal ($B_0$, $B_1$). The D/A converter circuit 21 provides the voltage signal $V_{RL}$ to the capacitors 25 and 27 in response to the third value (D=0) of the digital signal ($B_0$, $B_1$).

In this cyclic A/D converter, when the capacitors 25 and 27 are provided with the first and second voltage signals of the D/A converter circuit, respectively, the first and second voltage signals are combined via the capacitors 25 and 27.

Figure 2:
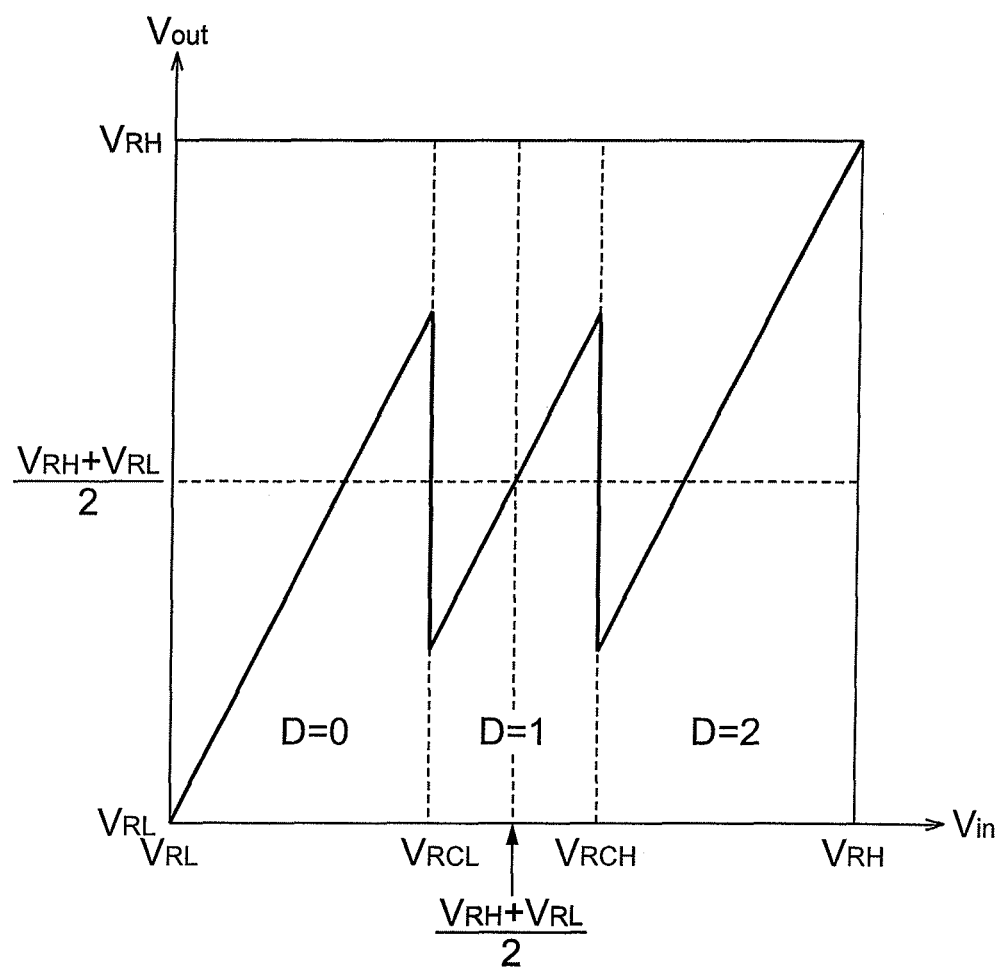
FIG. 2 is a diagram showing a relationship between an operational value $V_{OP}$ and a digital value of each cycle.

FIG. 2 is a diagram showing conversion characteristics between the operational value $V_{OP}$ and the digital value for each one cycle. For each value of the digital signal D, the range of the operational value is as follows.

For D=0, $V_{RCL} > V_{OP}$

For D=1, $V_{RCH} \geq V_{OP} \geq V_{RCL}$

For D=2, $V_{OP} > V_{RCH}$ (1)

The A/D converter circuit 17 compares the operational value $V_{OP}$ from the gain stage 15 with the predetermined reference voltages and thus the three redundant digital signals are generated.

The D/A converter circuit 21 provides the gain stage 15 with at least either one of the first and second voltage signals $V_{RH}$ and $V_{RL}$ in response to the control signal $V_{CONT}$. For this purpose, the D/A converter circuit 21 includes the first and second outputs 21a and 21b and the switching circuit 31. The switching circuit 31 provides the first output 21a with either of the first and second voltage signals $V_{RH}$ and $V_{RL}$ and also provides the second output 21b with either of the first and second voltage signals $V_{RH}$ and $V_{RL}$, in response to the control signal $V_{CONT}$.

In the D/A converter circuit 21, the voltage signals $V_{RH}$ and $V_{RL}$ are provided by first and second voltage sources 33 and 35, respectively. The first voltage source 33 provides the voltage $V_{RH}$. The second voltage source 35 provides the voltage $V_{RL}$. An output 33a of the first voltage source 33 is connected to the output 21a via a switch 31a in the switching circuit 31 and also connected to the output 21b via switches 31a and 31c in the switching circuit 31. An output 35a of the second voltage source 35 is connected to the output 21a via the switches 31b and 31c in the switching circuit 31 and also connected to the output 21b via the switch 31b in the switching circuit 31. The first and second outputs 21a and 21b of the D/A converter circuit 21 are connected to one end 25a of the first capacitor 25 and one end 27a of the capacitor 27, respectively. The switching of the switches 31a to 31c is controlled by the control signals $\phi_{DH}$, $\phi_{DS}$, and $\phi_{DL}$ from the logic circuit 17, respectively, and thus the values of the digital signal B1 and B0 determine which one is made active among the control signals $\phi_{DH}$, $\phi_{DS}$, and $\phi_{DL}$.

The D/A converter circuit 21 provides the value as shown in FIG. 2, for example, in response to the control signal from the logic circuit 17.

When a condition D=2 is satisfied, a voltage $V_{DA1} = V_{DA2} = V_{RH}$ is provided.

When a condition D=1 is satisfied, voltages $V_{DA1} = V_{RH}$ and $V_{DA2} = V_{RL}$ are provided.

When a condition D=0 is satisfied, a voltage $V_{DA1} = V_{DA2} = V_{RL}$ is provided. (2)

The gain stage 15 includes plural switches for performing connection among the capacitors 25, 27, and 29 and the operational amplifier circuit 23. While these switches are shown in FIG. 1, the arrangement of the switches 43, 47, 49, 51, 53, and 55 is an example. The control of these switches 43, 47, 49, 51, 53, and 55 is performed by a clock generator 41.

Figure 3:
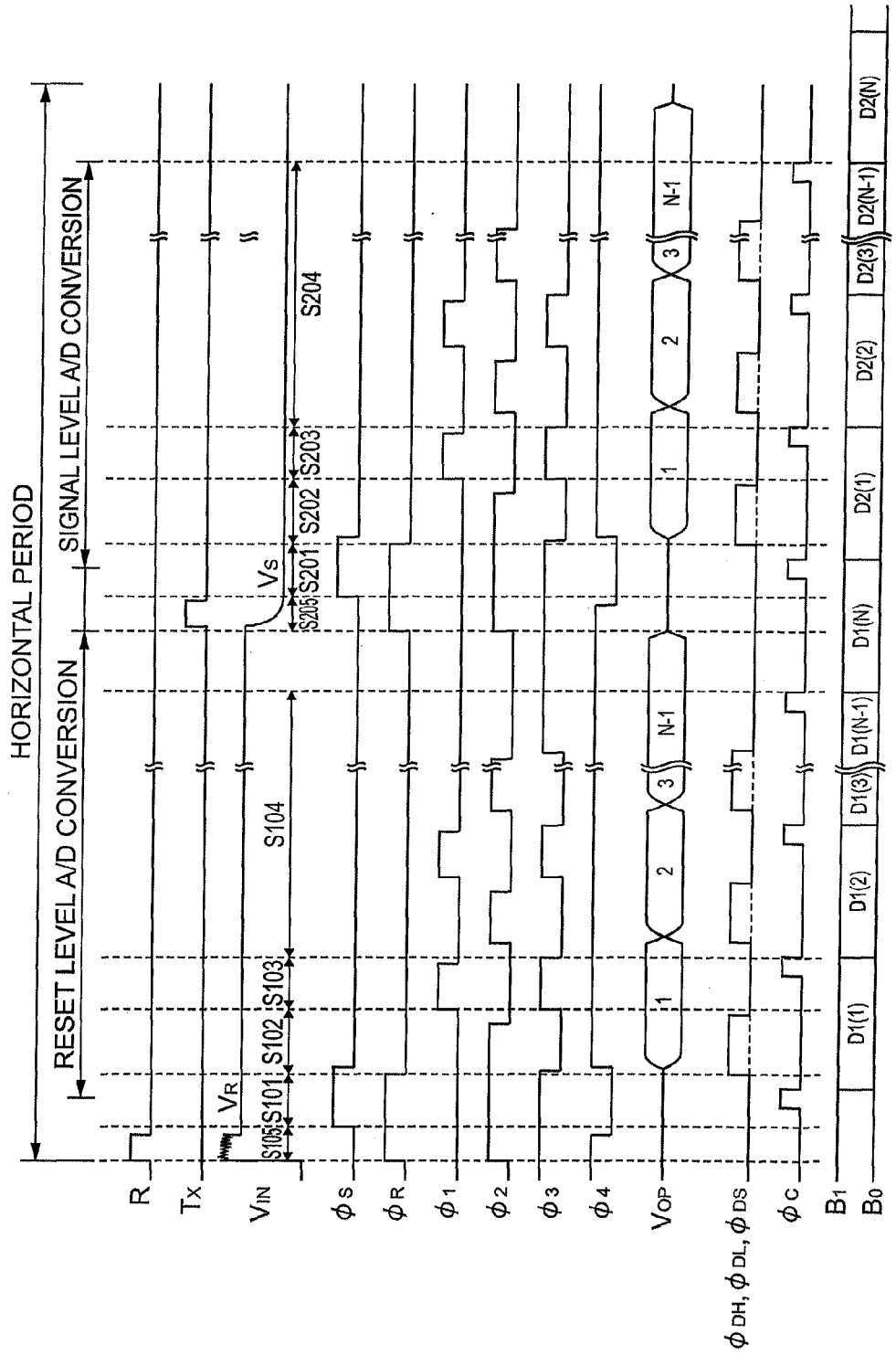
FIG. 3 is a diagram showing clock timing in the cyclic A/D converter shown in FIG. 1.
Figure 4:
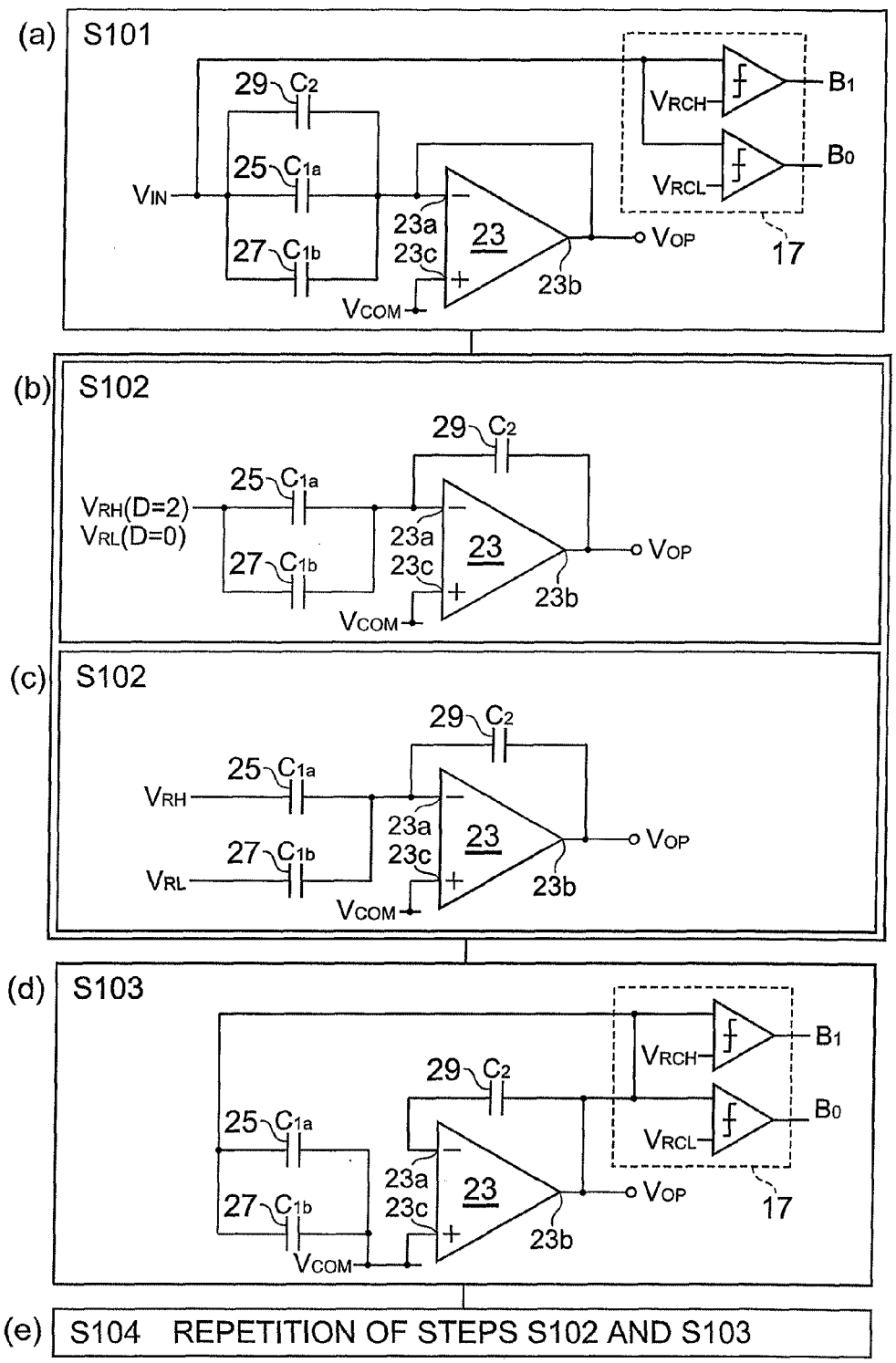
FIG. 4 is a diagram showing the action of the cyclic A/D converter shown in FIG. 1.

FIG. 3 is a diagram showing clock timing in the cyclic A/D converter shown in FIG. 1. FIG. 4 explains the action of the cyclic A/D converter shown in FIG. 1. The capacitor 25, 27 and 29 include capacitances $C_{1a}$, $C_{1b}$, and $C_2$, respectively.

An initial storage action is performed in Step S101 (and S201) of FIG. 4(a). In the initial storage action mode, the analog signal $V_{IN}$ is stored into the capacitors 25, 27, and 29.

For the storage, the capacitors 25, 27, and 29 are connected to each other in parallel. Further, the initial analog signal $V_{IN}$ is provided to the A/D converter circuit 17. The cyclic A/D converter 11 includes a first switching means for storing the analog signal $V_{IN}$ into the capacitors 25, 27, and 29. The initial analog signal $V_{IN}$ is provided to the A/D converter circuit 17 by the first switching means. The A/D converter circuit 17 generates the digital signal D1(1) (D2(1)). The signal D1(1) is provided to the logic circuit 19 and the logic circuit 19 generates the control signal $V_{CONT}$ controlling the D/A converter circuit 21.

For storing the analog signal $V_{IN}$ into the capacitors 25, 27, and 29, the terminal 25a of the capacitor 25 is connected to the input 15a via the switch 43, the terminal 27a of the capacitor 27 is connected to the input 15a via the switches 31c and 43, the terminal 29a of the capacitor 29 is connected to the input 15a via the switches 43 and 51, and also the reference potential is provided to the terminals 25b and 27b of the respective capacitors 25 and 27 via the switches 49 and 53, and the reference potential is provided to the terminal 29b of the capacitor 29 via the switch 53. In the first switching means, the switch 331c 43, 49, and 53 are turned on by clock signals ($\phi_{DS}=1$, $\phi_S=1$, $\phi_2=1$, and $\phi_R=1$) and also the switches 47 and 55 are turned off by the clock signals ($\phi_1=0$ and $\phi_4=0$). The terminal 29a of the capacitor 29 and the output 23b are separated from each other by the switch 55, and the output 23b is separated from the input 15a by the switch 55. When the gain stage 15 connects the input 23a and the output 23c of the operational amplifier circuit 23 to each other, the reference potential $V_{COM}$ is generated at the output 23c of the operational amplifier circuit 23. By this connection, the A/D converter circuit 17 receives the initial analog signal $V_{IN}$ and generates the digital signal D (1) in response to the clock $\phi_C$. It should be noted that, while the terminal 25a of the capacitor 25 and the terminal 27a of the capacitor 27 are connected to each other via the switch 31c, another switch can be provided for this connection. In the timing chart of FIG. 3, the signals ($\phi_{DH}$, $\phi_{DL}$, and $\phi_{DS}$) show a waveform for controlling the D/A converter circuit 21, for simplicity. The signal ($\phi_{DS}$) among these signals includes a signal waveform for connecting the terminal 25a of the capacitor 25 and the terminal 27a of the capacitor 27 to each other in addition to the signal waveform for the above control.

In Step S102 (and S202) of FIG. 4(b) and FIG. 4(c), the operational action is performed. In the operational action mode, the gain stage 15 generates the operational value $V_{OP}$ with the operational amplifier circuit 23 and the capacitors 25, 27, and 29. In the operational action, the capacitor 29 is connected between the output 15b and the input 15a of the operational amplifier circuit 15 and also the capacitors 25 and 27 are connected between the D/A converter circuit 21 and the input 23a. The cyclic A/D converter 11 includes a second switching means for the operational action. The D/A converter circuit 21 provides the gain stage 15 with the voltage signals $V_{DA1}$ and/or $V_{DA2}$ according to a value of the control signal $V_{CONT}$. In response to the application of the voltage signals $V_{DA1}$ and/or $V_{DA2}$, the operational value $V_{OP}$ is generated at the output 15b of the gain stage 15.

The operational value $V_{OP}$ is expressed by the following formula.

$$V_{OP}=(1+C_1/C_2) \times V_{IN} - V_R \quad (3)$$

$$C_1 = C_{1a} + C_{1b} \quad (4)$$

Further, the value $V_R$ is specified by voltage signals $V_{DA1}$ and $V_{DA2}$ from the D/A converter circuit 21 and is expressed as follows.

When a condition $D=2$ is satisfied, $V_R=(C_{1a}+C_{1b}) \times V_{RH}/C_2$

When a condition $D=1$ is satisfied, $V_R=(C_{1a} \times V_{RH} + C_{1b} \times V_{RL})/C_2$ When a condition $D=0$ is satisfied, $V_R=(C_{1a}+C_{1b}) \times V_{RL}/C_2$ (5)

When a relationship $C_{1a}=C_{1b}=C_2/2$ is satisfied, the formula (3) and the relationship (5) can be rewritten as follows.

$$V_{OP}=2 \times V_{IN} - V_R \quad (6)$$

Further, the relationship (3) also can be rewritten as follows.

When the condition $D=2$, $V_R = V_{RH}$

When the condition $D=1$ is satisfied, $V_R=(V_{RH}+V_{RL})/2$

When the condition $D=0$, $V_R = V_{RL}$ (7)

That is, the D/A converter circuit 21 generates three values, $V_{RH}$, $V_{RL}$ and a voltage at the midpoint thereof $(V_{RH}+V_{RL})/2$ for the three-value A/D conversion value. The generation of the three values can be performed by the use of only two reference power sources, and thus the number of the reference voltage sources and a wiring space providing the reference voltage can be saved.

In this action, respective absolute value shifts of the reference voltages $V_{RH}$ and $V_{RL}$ do not affect the linearity of the A/D conversion characteristics but only the accuracy of generating the midpoint voltage affects the linearity. The capacitance ratio accuracy of the capacitors specifies this midpoint voltage. The capacitance ratio is extremely higher than the resistance ratio accuracy, and the highly accurate A/D converter 11 can be provided.

For generating the operational value $V_{OP}$, the respective terminals 25b and 27b of the capacitors 25 and 27 are connected to the input 23a via the switch 49 and the terminal 29a of the capacitor 29 is connected to the output 23b via the switch 55. In the second switching means, the switches 49 and 55 are turned on by the clock signals ($\phi_2=1$ and $\phi_4=1$) and also the switches 43, 47, 51, and 53 are turned off by the clock signals ($\phi_S=0$, $\phi_1=0$, $\phi_3=0$, and $\phi_R=0$). The respective terminals 25b and 27b of the capacitors 25 and 27 are separated from the reference potential line $L_{COM}$ by the switch 47, and the respective terminals 25a and 27a of the capacitors 25 and 27 are separated from the output 23b by the switch 51. The input 23a and the output 23b are separated from each other by the switch 53.

In Step S103 (and S203) of FIG. 4(d), the storage action is performed. In the storage action mode, the operational value $V_{OP}$ on the output 23b of the operational amplifier circuit 23 is stored into the first and second capacitors 25 and 27. For the storage, the capacitors 25 and 27 are connected in parallel to each other. The cyclic A/D converter 11 includes a third switching means for storing the operational value $V_{OP}$. Further, the operational value $V_{OP}$ is provided to the A/D converter circuit 17 as an analog signal by the third switching means.

For storing the operational value $V_{OP}$ into the capacitors 25 and 27, the terminal 25a of the capacitor 25 is connected to the output 23b via the switches 51 and 55, the terminal 27a of the capacitor 27 is connected to the output 23b via the switches 31c, 51, and 55, and also the reference potential is supplied to the respective terminals 25b and 27b of the capacitors 25 and 27 via the switch 47. In the third switching means, the switches 31c, 47, 51, and 55 are turned on by the clock signals ($\phi_{DS}=1$, $\phi_1=1$, $\phi_3=1$, and $\phi_4=1$) and also the switches 43, 49, and 53 are turned off by the clock signals ($\phi_S=0$, $\phi_2=0$, and $\phi_R=0$). The respective terminals 25a and 27a of the capacitors 25 and 27 are separated from the input 15a by the switch 43 and the respective terminals 25b and 27b of the capacitors 25 and 27 are separated from the input 23a by the switch 49. In the operational action mode of the gain stage 15, the input 23a of the operational amplifier circuit 23 comes to have the reference potential $V_{COM}$. Further, the operational value $V_{OP}$ is provided to the A/D converter circuit 17 by the third switching means (switch 55 in the present embodiment).

In Step S104 (S204) of FIG. 4(e), Step S102 (S202) and Step S103 (S203) are repeated and the digital signals D1(2) to D1(N) (D2(2) to D2(N)) are generated. This repetition is performed until an A/D conversion result having a predetermined number of bits is obtained. For example, a resolution corresponding to approximately N+1 bits can be obtained in N cycles.

Figure 5:
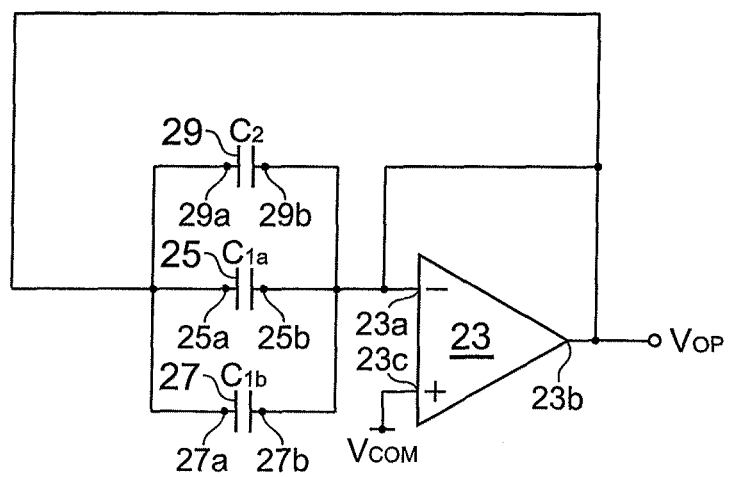
FIG. 5 is a diagram showing a circuit connection for an initial reset action.

If necessary, an initial reset action is performed in Step S105 (and S205) of FIG. 5. For the initial reset action, both ends in each of the capacitors 25, 27, and 29 are connected with each other. Further, for the succeeding action, the reference potential $V_{COM}$ is provided to the both ends in each of the capacitors 25, 27, and 29. The gain stage 15 connects the capacitors 25, 27, and 29 between the input 23a and the output 23b of the operational amplifier circuit 23 and also connects the input 23a to the output 23b in the operational amplifier circuit 23. In a fourth switching means including the fourth switching means for the initial reset action, the switches 31c, 49, 51, 53, and 55 are turned on by the clock signals ($\phi_{DS}=1$, $\phi_2=1$, $\phi_3=1$, $\phi_R=1$, and $\phi_4=1$) and also the switches 43 and 47 are turned off by the clock signals ($\phi_S=0$ and $\phi_1=0$). The reference potential $V_{COM}$ is generated at the output 23c of the operational amplifier circuit 23.

In the three-value A/D conversion, the reference voltages $V_{RCH}$ and $V_{RCL}$ are provided by the formulas (8) and (9), respectively.

$$V_{RCH}=(3\times V_{RH}+5\times V_{RL})/8 \qquad (8)$$

$$V_{RCL}=(5\times V_{RH}+3\times V_{RL})/8 \qquad (9)$$

A conversion characteristic for one cycle expressed by the formulas (1), (2), (8), and (9) is shown in FIG. 2.

Figure 6:
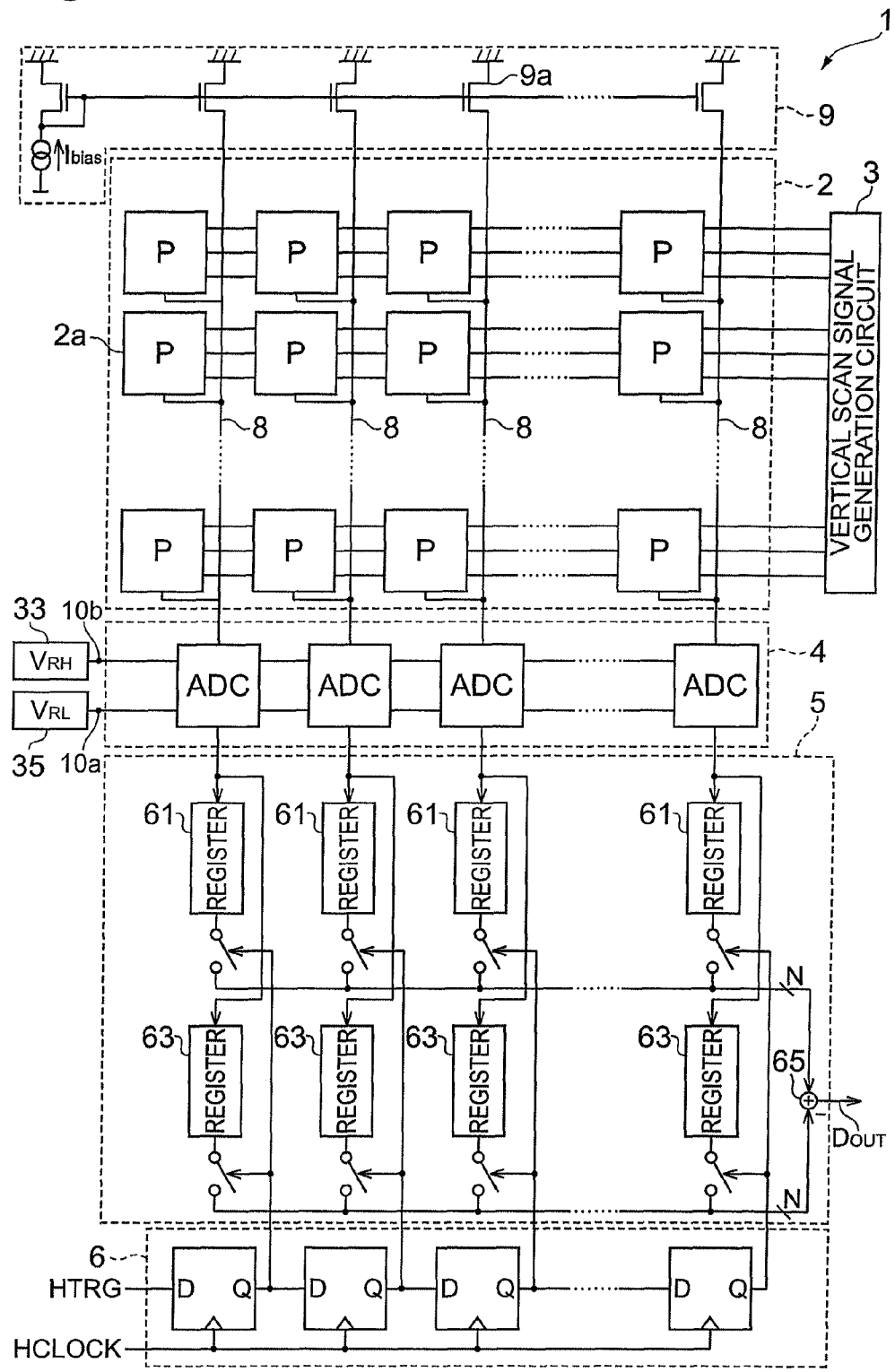
FIG. 6 is a diagram showing a circuit block of an image sensor device.

FIG. 6 is a diagram showing a circuit block of an image sensor device. With reference to FIG. 6, in an image sensor 1, a vertical shift register 3 is connected to a row of a cell array including an array of image sensor cell 2a, and an AD converter array 4 is connected to a column of the cell array 2. The A/D converter array 4 includes plural A/D converters arranged in an array. The A/D converter 11 can be used for each of the A/D converters. Each of the A/D converters 11 is connected to an image sensor cell 2a via a column line 8. The column line 8 is connected with a bias circuit 9, and the bias circuit 9 includes a current source transistor 9a and a current source $I_{bias}$ provided to each of the column lines 8. In this image sensor device 1, an A/D conversion value (D1(1) to D1(N)) of a reset level signal S1 and an A/D conversion value (D2(1) to D2(N)) of a signal level signal S2 are generated according to the timing chart of FIG. 3.

In this image sensor device 1, each of the cyclic A/D converters uses the D/A converter circuit 21 for the gain stage 15. Accordingly, the area of the image sensor device 1 can be minimized. If necessary, the output of the A/D converter array 4 is converted into an M bit digital code corresponding to a signal from a pixel 2a by a redundant-nonredundant expression conversion circuit. 7.

The image sensor device 1 further includes a reference voltage circuit 33 generating a voltage signal $V_{RH}$, a reference voltage circuit 35 generating a voltage signal $V_{RL}$, a conductor line 10a connected to the reference voltage circuit 33, and a conductor line 10b connected to the reference voltage circuit 35. The conductor lines 10a and 10b extend in a direction crossing a direction in which the column line 8 extends. The D/A converter circuit 21 in each of the cyclic A/D converters 11 is connected to the conductor lines 10a and 10b. This image sensor device uses two conductor lines 10a and 10b instead of three conductor lines for providing the reference voltage signals $V_{RH}$ and $V_{RL}$ for the cyclic A/D converter 11.

Figure 7:
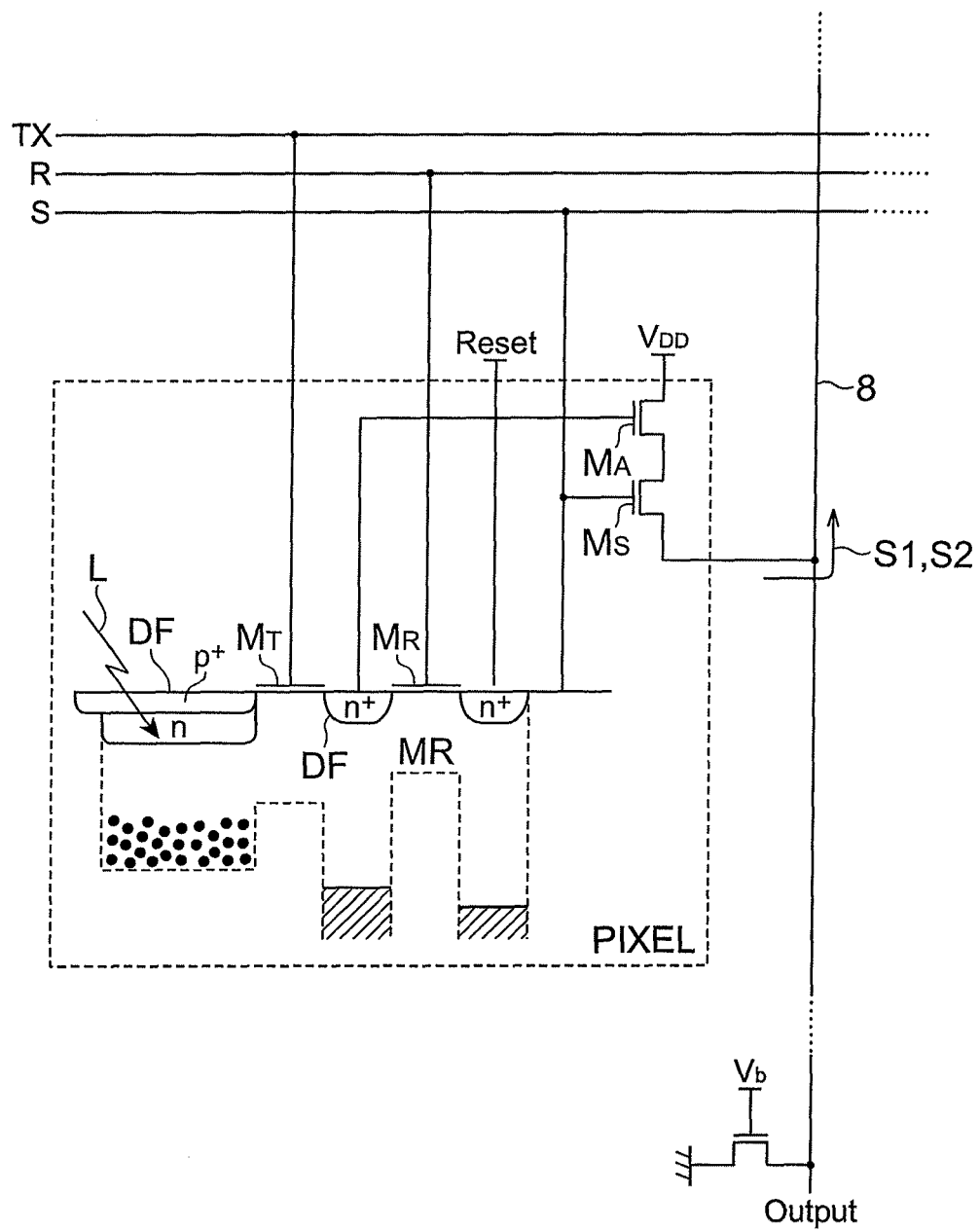
FIG. 7 is a diagram showing a pixel of an image sensor.

FIG. 7 is a diagram showing a pixel of the image sensor. The pixel 2a has a structure of a CMOS image sensor cell, for example. A photodiode DF receives light L from one pixel related to an image. A gate of a selection transistor $M_S$ is connected to a row selection line S extending in the row line direction. A gate of a reset transistor $M_R$ is connected to a reset line R. A gate of a transfer transistor $M_T$ is connected to a transfer selection line extending in the row direction. One end of the photodiode DF is connected to a floating diffusion layer FD via the transfer transistor $M_T$. The floating diffusion layer FD is connected to a reset potential line Reset via the reset transistor $M_R$ and also connected to a gate of a transistor $M_A$. One current terminal (e.g., drain) of the transistor $M_A$ is connected to the column line 8 via the selection transistor $M_S$. The transistor $M_A$ provides the column line with a potential according to an electric charge in the floating diffusion layer FD via the selection transistor $M_S$.

In the pixel having this structure, a noise cancelling action is performed as follows. First, a reset control signal R is provided to the reset transistor $M_R$ and the floating diffusion layer FD is reset. This reset level is read out via the amplifier transistor $M_A$. Subsequently, a charge transfer control signal TX is supplied to the transfer transistor $M_T$ and a light-induced signal charge is transferred to the floating diffusion layer from the photodiode DF. After that, this signal level is read out via the transistor $M_A$. In this manner, the pixel 2a can generate the signal S1 indicating the reset level and the signal S2 indicating the signal level superimposed on the reset level.

A difference between this reset level and the signal level is obtained by a digital noise cancelling circuit 5. Thus, noises, such as a fixed-pattern noise caused by a transistor characteristic variation among the pixels 2a and a reset noise occurring when the floating diffusion layer is reset, are cancelled. The A/D converter array 4 is connected with the noise cancelling circuit 5 and the output of the A/D converter array 4 is provided to the noise cancelling circuit 5. An A/D conversion value corresponding to a signal from the pixel 2a is stored into the noise cancelling circuit 5. The noise cancelling circuit 5 provides a digital signal $D_{OUT}$ to the output of the image sensor 1 in response to a signal from a horizontal shift register 6. The digital noise cancelling is performed by obtaining a difference between a bit sequence expressing the signal S1 which indicates the reset level and a bit sequence expressing the signal S2 which indicates the signal level superimposed on the reset level.

The noise cancelling circuit 5 includes a first storage circuit 61, a second storage circuit 63, and an operational circuit 65. The first storage circuit 61 stores the A/D conversion value (D1(1) to D1(N)) generated according to the timing chart of FIG. 3. The second storage circuit 63 stores the A/D conversion value (D2(1) to D2(N)) generated according to the timing chart of FIG. 3. The operational circuit 65 generates an output $V_{OUT}$ for which the digital noise cancelling has been provided, by obtaining a difference between the respective bit sequences stored in the two storage circuits 61 and 63.

Prior to the generation of the difference, a bit sequence of a redundant code (takes three values, D=0, 1, and 3, for one digit) is converted into a bit sequence of a nonredundant code. When an A/D conversion output value sequence of a N-digit redundant code is expressed as $D(1), D(2), \ldots, D(N-1), D(N)$, $D(1)$ is the highest order bit and $D(N)$ is the lowest order bit, and then each output value is expressed as $D(i-1)=(B0(i-1), B1(i-1))$. A bit sequence for each digit is generated from a sequence of the A/D conversion output. The B0 bit sequence is expressed as $(B0(1), B0(2), \ldots, B0(N))$ and the B1 bit sequence is expressed as $(B1(0), B1(2), \ldots, B1(N))$.

The conversion from the redundant code to the nonredundant code is performed as follows. When the outputs B1 and B0 of the A/D converter circuit 17 are specified by a correspondence to the redundant code D,

| D | B1 | B0 |
|---|----|----|
| 0 | 0  | 0  |
| 1 | 0  | 1  |
| 2 | 1  | 1  | the nonredundant code is expressed by a binary number of N+1 digits which is obtained by the addition of the B0 bit sequence of N digits and the B1 bit sequence of N digits. The addition is performed by an adder. Each of the A/D conversion values of the reset level and signal level signals is converted into the nonredundant code, and then one of these nonredundant codes is converted into a complement number expression and subtraction is performed by the adder, Thus, the noise cancelling is performed.

Figure 8:
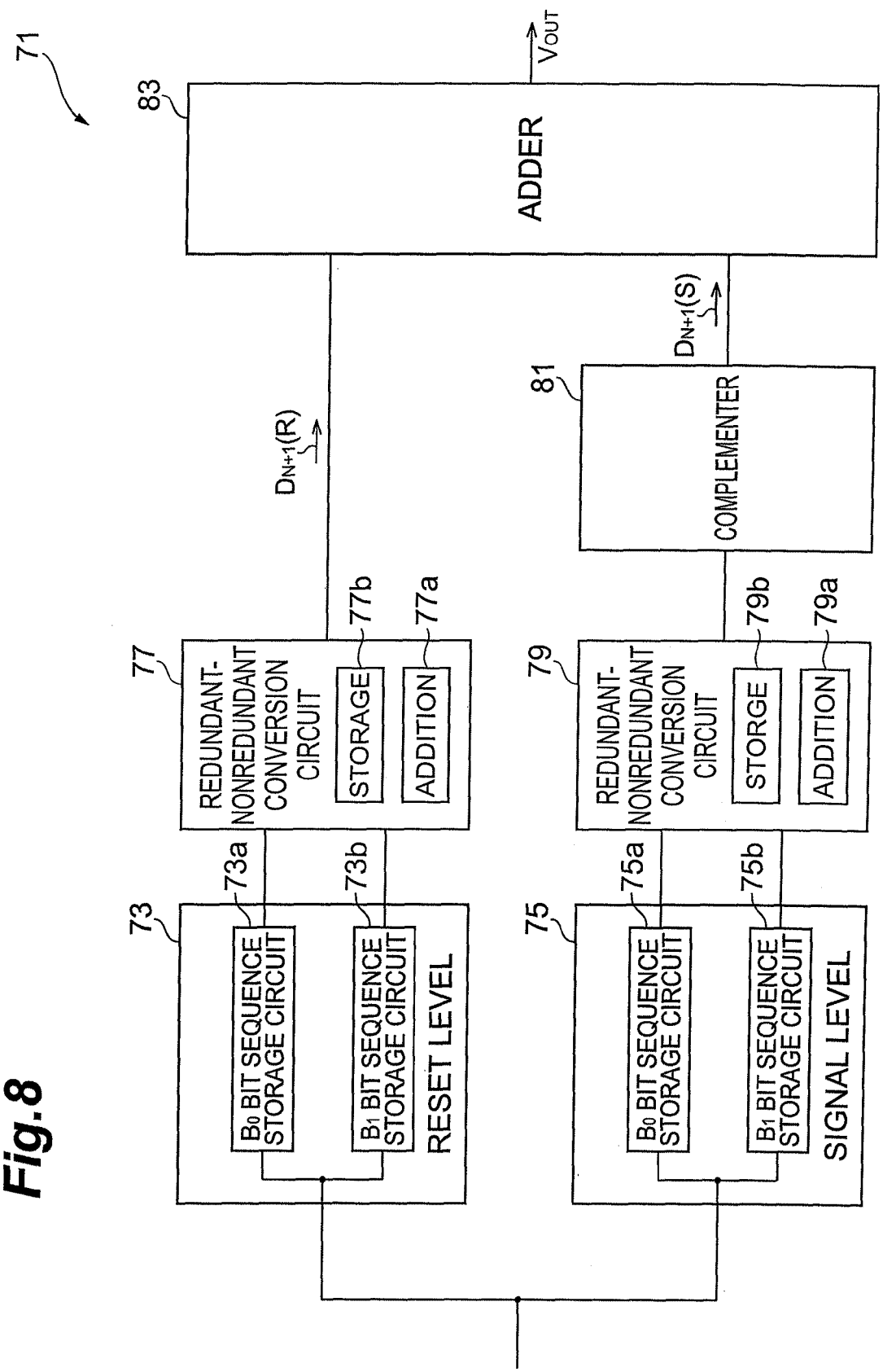
FIG. 8 is a block diagram showing an operational circuit in a digital noise cancelling circuit.

FIG. 8 is a block diagram showing the operational circuit in the digital noise cancelling circuit. The redundant bit sequence of the reset level from the A/D converter array 4 is stored into a storage circuit 73. The storage circuit 73 includes a storage circuit 73a for the B0 bit sequence and a storage circuit 73b for the B1 bit sequence. The storage circuit 73 is connected to a redundant-nonredundant conversion circuit 77. An adder 77a of the redundant-nonredundant conversion circuit 77 converts the digital value of the N bit redundant expression into the digital value $D_{N+1}(R)$ of the N+1 bit nonredundant expression. Further, the redundant bit sequence of the signal level from the A/D converter array 4 is stored into a storage circuit 75. The storage circuit 75 includes a storage circuit 75a for the B0 bit sequence and a storage circuit 75b for the B1 bit sequence. The storage circuit 75 is connected to the redundant-nonredundant conversion circuit 79. An adder 79a of the redundant-nonredundant conversion circuit 79 converts the digital value of the N bit redundant expression into the digital value $D_{N+1}(S)$ of the N+1 bit nonredundant expression. The redundant-nonredundant conversion circuit 79 is connected to a complementer 81 and the complementer 81 generates a digital value of a nonredundant complement expression (digital value of N+1 bit nonredundant complement expression) $D_{N+1}(S)$. An adder 83 adds the digital value $D_{N+1}(R)$ and the digital value $D_{N+1}(S)$ and generates a noise-cancelled digital value $V_{OUT}$.

This image sensor device 1 can cancel the reset level noise caused by the reset action from the signal which is generated from an electric charge indicating the reset noise and an electric charge indicating a light reception amount, by utilizing the respective digital signals of the signals S1 and S2 from the image sensor cell 2a.

In an example of the digital noise cancelling circuit, the redundant-nonredundant conversion circuits 77 and 79 can be included in the storage circuits 61 and 63 shown in FIG. 6, respectively. Further, the redundant-nonredundant conversion circuits 77 and 79 can include the storage circuits 77b and 79b each storing the digital value of the N+1 bit nonredundant expression, respectively. The storage circuit 63 can include the complementer 81. The operational circuit 65 can include the adder 83. By this configuration, the digital value of the nonredundant expression is generated in the circuit provided for each column and the operational circuit 65 is used commonly for all the columns.

In another example of the digital noise cancelling circuit, the redundant-nonredundant conversion circuits 77 and 79 and the complementer 81 can be included in the operational circuit 65 shown in FIG. 6. The operational circuit 65 receives the two digital values of the N bit redundant expression which are indicated by the signals S1 and S2, respectively, and performs the redundant-nonredundant conversion for these digital values and also generates the difference value. By this configuration, the redundant-nonredundant conversion circuit and the differential unit can be used commonly for all the columns.

Further, the difference between the reset level and the signal level can be cancelled in the A/D conversion. Thus, the noises such as the fixed-pattern noise caused by the transistor characteristic variation among the pixels 2a and the reset noise generated when the floating diffusion layer is reset, can be cancelled.

Figure 9:
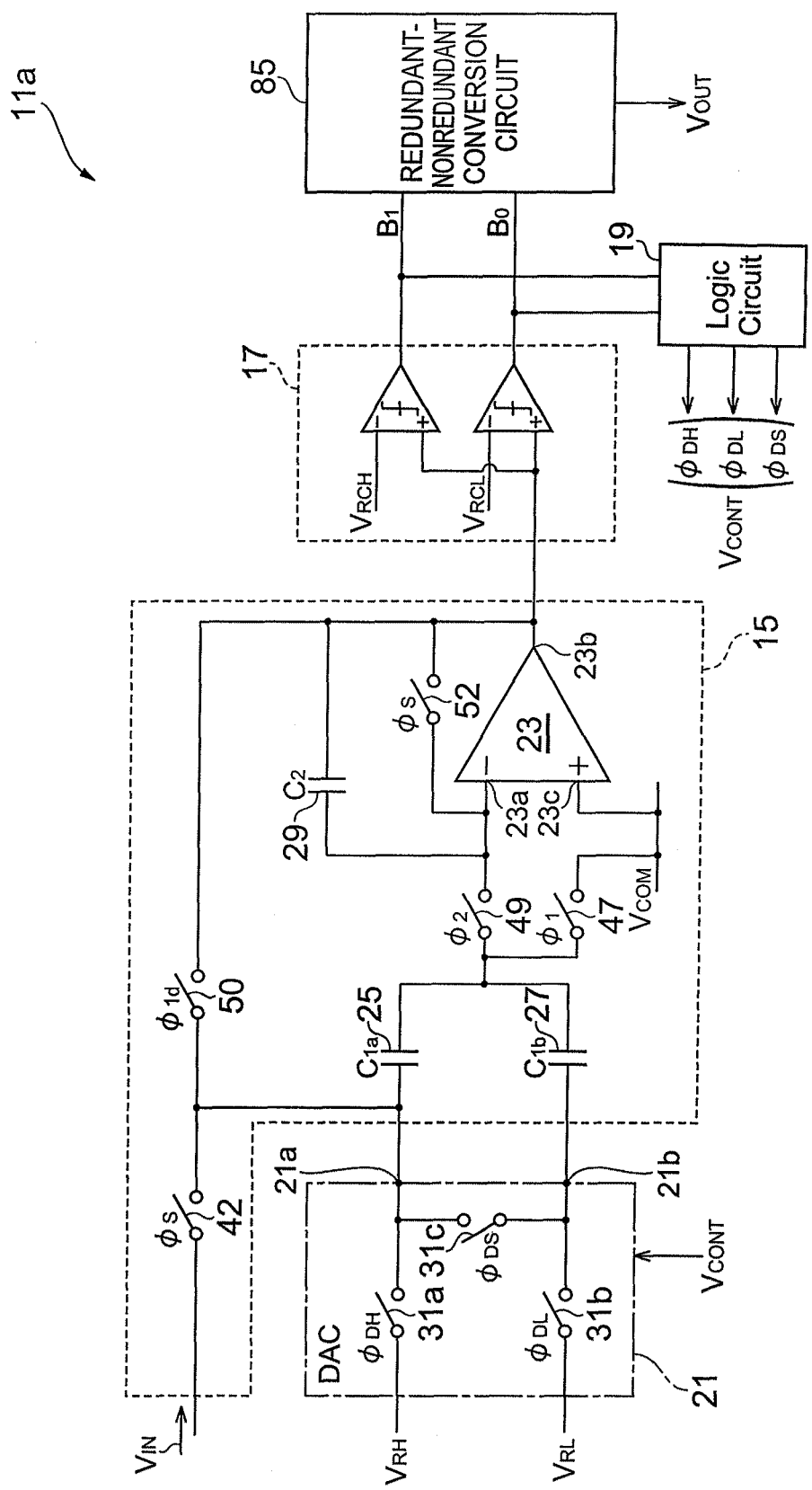
FIG. 9 is a diagram showing a circuit block of a cyclic A/D converter according to the present embodiment.

FIG. 9 is a diagram showing a circuit block of a cyclic A/D converter according to the present embodiment. This cyclic A/D converter 11a is provided with a gain stage 15, an A/D converter circuit 17, a logic circuit 19, and a D/A converter circuit 21. The gain stage 15 provides an input 15a receiving an analog signal $V_{IN}$ to be converted to a digital value and an output 15b providing an operational value $V_{OP}$ for each one cycle. Further, the gain stage 15 includes a single end type operational amplifier circuit 23 and first to third capacitors 25, 27, and 29.

Figure 10:
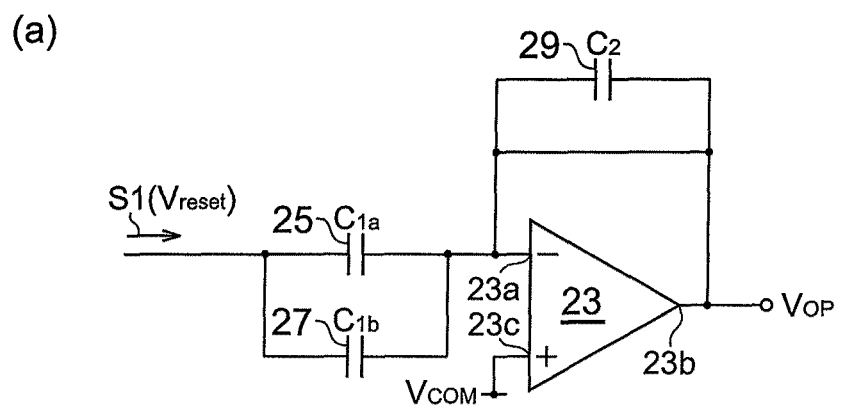
FIG. 10 is a diagram showing principal steps for analog CDS.
Figure 10:
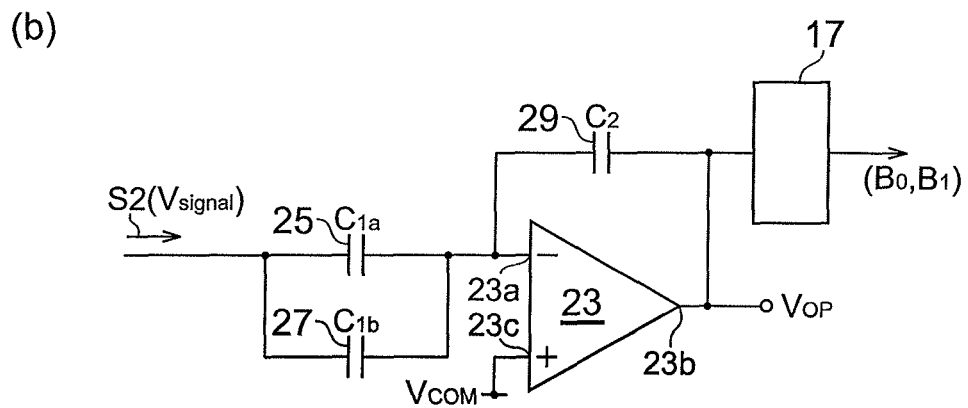

FIG. 10 is a diagram showing principal steps for analog correlated double sampling (CDS). In the steps of FIG. 10(a) and FIG. 10(b), an initial storage action is performed. In the first half of the initial storage action mode, a signal S1 indicating a reset level is stored into the capacitors 25 and 27. In the step of FIG. 10(a), the cyclic A/D converter 11a includes a fifth switching means for storing the signal S1 into the capacitors 25 and 27.

For storing the signal S1 into the capacitors 25 and 27, respective terminals 25a and 27a of the capacitors 25 and 27 are connected to the input 15a, and also a reference potential is supplied to respective terminals 25b and 27b of the capacitors 25 and 27. In the fifth switching means, a switches 42, 49, and 52 are turned on by clock signals ($\phi_S=1$, $\phi_2=1$, and $\phi_S=1$) and switches 47 and 50 are turned off by the clock signals ($\phi_1=0$ and $\phi_{1d}=0$). When the gain stage 15 connects an input 23a and an output 23c of the operational amplifier circuit 23 to each other, a reference potential $V_{COM}$ is generated at the output 23c of the operational amplifier circuit 23. By this connection, the capacitors 25 and 27 receive the signal S1 indicating the reset level. The capacitors 25 and 27 are connected in parallel to each other for the storage.

In the second half of the initial storage mode, a signal S2 indicating a signal level is received at the capacitors 25 and 27. In the step of FIG. 10(b), the cyclic A/D converter 11a stores the signal S2 into the capacitors 25 and 27 and also generates a difference between the signal S1 and the signal S2. The difference is stored into the capacitors 25, 27, and 29 for the succeeding cyclic action.

The cyclic A/D converter 11a includes a sixth switching means for generating the difference between the signal S1 and the signal S2. For the storage and the difference generation, the capacitors 25 and 27, which are connected in parallel, are connected between the input 15a and the input 23a of the operational amplifier circuit 23, and also the capacitor 29 is connected between the input 23a and the output 23b of the operational amplifier circuit 23.

In the sixth switching means, switches 42 and 49 are turned on by the clock signals ($\phi_S=1$ and $\phi_2=1$) and also switches 47, 50, and 52 are turned off by the clock signals ($\phi_1=0$, $\phi_{1d}=0$, and $\phi_S=0$). When the gain stage 15 connects the input 23a and the output 23c of the operational amplifier circuit 23 to each other, the operational value $V_{OP}$ is generated at the output 23c of the operational amplifier circuit 23. By this connection, the output 23c of the operational amplifier circuit 23 is expressed as $V_{OP}=(C_{1a}+C_{1b})/C_2 \times (V_R-V_S)$.

This A/D converter 11a performs the A/D conversion of the signal in which the reset level by the reset action has been cancelled, by using the gain stage 15. This A/D conversion is performed in the steps shown in FIG. 4(b) to FIG. 4(d).

While the principle of the present invention has been explained in the preferable embodiments, it is recognized by a person skilled in the art that the present invention can be changed in the arrangement and particulars without departing from such a principle. The present invention is not limited to the specific configurations disclosed in the present embodiments. Accordingly, all the modifications and changes falling within the range of the patent claims and the spirit thereof call for rights, respectively.

REFERENCE SIGNS LIST

1: Image sensor, 2: Cell array, 2a: Image sensor cell, 3: Vertical shift register, 4: A/D converter array, 5: Noise cancelling circuit, 8: Column line, 9: Bias circuit, 10a and 10b: Conductor line, 11: Cyclic A/D converter, 15: Gain stage, 15a: Input of the gain stage, 15b: Output of the gain stage, 17: A/D converter circuit, 17a, 17b: Comparator, 19: Logic circuit, 21: D/A converter circuit, 23: Operational amplifier circuit, 23a, 23c: Input of the operational amplifier circuit, 23b: Output of the operational amplifier circuit, 25, 27, 29: Capacitor, $V_{IN}$: Analog signal, $L_{COM}$: Reference potential line, $V_{COM}$: Reference potential, $V_{OP}$: Operational value (signal), D: Digital signal, $V_{RCH}$ and $V_{RCL}$: Reference signal, $B_0$ and $B_1$: Bit

The invention claimed is:

1. A cyclic A/D converter, comprising:
a gain stage including an input receiving an analog signal to be converted to a digital value, an output, and a single end type operational amplifier circuit having a first input, a second input, and output;
an A/D converter circuit generating a digital signal including plural bits according to a signal from the output of the gain stage or the analog signal;
a logic circuit generating a control signal having first to third values according to the digital signal; and
a D/A converter circuit providing the gain stage with at least either one of first and second voltage signals in response to the control signal, wherein
the gain stage includes first to third capacitors,
the second input of the operational amplifier circuit receives a reference potential,
the gain stage performs an operational action generating an operational value with the operational amplifier circuit and the first to third capacitors and a storage action storing the operational value into the first and second capacitors, and
the D/A converter circuit has first and second outputs respectively connected to the first and second capacitors, and wherein
in the operational action, the third capacitor is connected between the output and the first input of the operational amplifier circuit and also the first and second capacitors are connected between the D/A converter circuit and the first input, and resultantly the operational value is generated at the output of the gain stage, and
the D/A converter circuit provides the first output with either of the first and second voltage signals and also includes a switching circuit for providing the second output with either of the first and second voltage signals, in response to the control signal.

2. The cyclic A/D converter according to claim 1, wherein the switching circuit supplies the first voltage signal to both of the first and second capacitors in response to the first value of the control signal, supplies the first and second voltage signals to the first and second capacitors, respectively, in response to the second value of the control signal, and supplies the second voltage signal to both of the first and second capacitors in response to the third value of the control signal.

3. The cyclic A/D converter according to claim 1, wherein the switching circuit comprises a first switch connected between a source of the first voltage signal and the first output, a second switch connected between a source of the second voltage signal and the second output, and a third switch connected between the first output and the second output,
the D/A converter circuit supplies the first voltage signal to the first capacitor and the second capacitor via the first output and the second output, respectively, by turning on the first switch and the third switch in response to the first value of the control circuit,
the D/A converter circuit supplies the first voltage signal to the first capacitor via the first output by turning on the first switch and also supplies the second voltage signal to the second capacitor via the second output by turning on the second switch, in response to the second value of the control signal, and
the D/A converter circuit supplies the second voltage signal to the first capacitor and the second capacitor via the first output and the second output, respectively, by turning on the second switch and the third switch in response to the third value of the control signal.

4. The cyclic A/D converter according to claim 1, wherein in the storage action, the third capacitor is connected between the output and the first input of the operational amplifier circuit and also the first and second capacitors are connected between the output of the operational amplifier circuit and the reference potential.

5. The cyclic A/D converter according to claim 1, wherein the gain stage further performs an initial reset action,
in the initial reset action, the first to third capacitors are connected between the first input of the operational amplifier circuit and the output of the operational amplifier circuit and also the first input of the operational amplifier circuit is connected to the output of the operational amplifier circuit.

6. The cyclic A/D converter according to claim 1, wherein in an initial storage action, the gain stage connects the first input of the operational amplifier circuit and the output of the operational amplifier circuit to each other and also receives the analog signal at the first to third capacitors.

7. An image sensor device, comprising:
a cell array including an array of image sensor cells; and
a converter array which is connected to the cell array and includes plural cyclic A/D converters according to any one of claims 1 to 6, wherein
each of the cyclic A/D converters is connected to the image sensor cell via a column line of the cell array, and
each of the cyclic A/D converters stores the analog signal into the first to third capacitors before the operational action.

8. The image sensor device according to claim 7, wherein
the image sensor cell can generate a first signal indicating a reset level and a second signal indicating a signal level superimposed on the reset level,
the gain stage connects the output and the first input of the operational amplifier circuit to each other and also connects the first and second capacitors between the input of the gain stage and the first input of the operational amplifier circuit, and then receives the signal of the reset level at the first and second capacitors, and
the gain stage connects the third capacitor between the output and the first input of the operational amplifier circuit and also connects the first and second capacitors between the input of the gain stage and the first input of the operational amplifier circuit, and then receives the signal of the signal level at the first and second capacitors.

9. The image sensor device according to claim 7, further comprising
a noise cancelling circuit, wherein
the image sensor cell can generate a first signal which indicates a reset level and includes a first redundant bit sequence and a second signal which indicates a signal level superimposed on the reset level and includes a second redundant bit sequence, and
the noise cancelling circuit includes a first storage circuit storing a first A/D conversion value of the reset level signal, a second storage circuit storing a second A/D conversion value of the signal level signal, and an operational circuit which generates a difference between the first A/D conversion value and the second A/D conversion value and subtracts the reset level from the second signal to cancel a reset noise.

10. The image sensor device according to claim 9, wherein
the operational circuit includes first and second redundant-nonredundant conversion circuits converting the first and second redundant bit sequences into first and second nonredundant bit sequences respectively, a complementer, and an adder, and
the operational circuit outputs a difference between an output value of the first redundant-nonredundant conversion circuit and an output value of the second redundant-nonredundant conversion circuit as a noise-cancelled value.

11. The image sensor device according to claim 7, further comprising:
a first reference voltage circuit generating the first voltage signal;
a second reference voltage circuit generating the second voltage signal;
a first conductor line connected to the first reference voltage circuit; and
a second conductor line connected to the second reference voltage circuit, wherein
the D/A converter circuit in each of the cyclic A/D converters is connected to the first and second conductor lines.

12. A method which generates a digital signal from an analog signal by using a cyclic A/D converter, comprising the steps of:
(a) storing A signal having an analog value into first to third capacitors;
(b) generating $D_0$ signal which represents a digital value of the A signal and has any of first to third values;
(c) after the generation of the $D_0$ signal, connecting the third capacitor between an output of an operational amplifier circuit and a first input of the operational amplifier circuit and also connecting each one end of the first and second capacitors to the first input of the operational amplifier circuit, and then generating an operational value at the output of the operational amplifier circuit by applying a D/A signal to the other end of the first capacitor and the other end of the second capacitor;
(d) by connecting the third capacitor between the output and the first input of the operational amplifier circuit and also connecting the first and second capacitors between the output of the operational amplifier circuit and the referential potential, storing the operational value into the first and second capacitors and also generating $D_i$ signal which represents a digital value of the operational value and has any one of first to third values; and
(e) repeating the steps (c) and (d) and generating the digital signal, wherein
the D/A signal is at least either one of first and second voltage signals having analog values corresponding to the $D_0$ signal and the $D_i$ signal, respectively,
when the $D_0$ signal indicates the first value, the first voltage signal is applied to the other end of the first capacitor and the other end of the second capacitor,
when the $D_0$ signal indicates the second value, the second voltage signal is applied to the other end of the first capacitor and the other end of the second capacitor,
when the $D_0$ signal indicates the third value, the first and second voltage signals are applied to the other ends of the first and second capacitors, respectively,
when the $D_i$ signal indicates the first value, the first voltage signal is applied to the other end of the first capacitor and the other end of the second capacitor,
when the $D_i$ signal indicates the second value, the second voltage signal is applied to the other end of the first capacitor and the other end of the second capacitor, and
when the $D_i$ signal indicates the third value, the first and second voltage signals are applied to the other ends of the first and second capacitors, respectively.

* * * * *

UNITED STATES PATENT AND TRADEMARK OFFICE
CERTIFICATE OF CORRECTION

PATENT NO.        : 8,581,171 B2                                                              Page 1 of 1
APPLICATION NO. : 13/124319
DATED             : November 12, 2013
INVENTOR(S)       : Kawahito et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 349 days.

Signed and Sealed this
Twenty-second Day of September, 2015

Michelle K. Lee
*Director of the United States Patent and Trademark Office*